(12) United States Patent
Wada

(10) Patent No.: US 6,586,753 B2
(45) Date of Patent: Jul. 1, 2003

(54) ELECTRON BEAM APPARATUS AND ELECTRON BEAM ADJUSTING METHOD

(75) Inventor: Yasumitsu Wada, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/270,068

(22) Filed: Oct. 15, 2002

(65) Prior Publication Data
US 2003/0071230 A1 Apr. 17, 2003

(30) Foreign Application Priority Data
Oct. 15, 2001 (JP) ........................................ 2001-317137

(51) Int. Cl.[7] .............................. H01J 3/26; G01J 3/14; G01J 1/00; G21K 7/00; G21G 5/00
(52) U.S. Cl. ................................. 250/491.1; 250/492.1; 250/492.2; 250/306; 250/307; 250/310; 250/396 R; 250/397; 250/398; 250/399
(58) Field of Search .......................... 250/491.1, 492.1, 250/492.2, 492.21, 492.22, 492.23, 492.3, 310, 307, 311, 309, 396 R, 396 ML, 252.1 R

(56) References Cited

U.S. PATENT DOCUMENTS

| | | | | |
|---|---|---|---|---|
| 3,874,916 A | * | 4/1975 | Livesay et al. | 430/272.1 |
| 4,123,798 A | * | 10/1978 | Cook et al. | 365/237 |
| 4,282,548 A | * | 8/1981 | Plummer | 348/187 |
| 4,649,324 A | * | 3/1987 | Guerra et al. | 315/370 |
| 4,683,378 A | * | 7/1987 | Shimase et al. | 250/492.2 |
| 4,689,516 A | * | 8/1987 | Yokoyama et al. | 310/317 |
| 4,803,644 A | * | 2/1989 | Frazier et al. | 702/150 |
| 4,814,829 A | * | 3/1989 | Kosugi et al. | 355/43 |
| 4,843,563 A | * | 6/1989 | Takahashi et al. | 716/21 |
| 4,910,679 A | * | 3/1990 | Takahashi et al. | 716/21 |
| 4,943,722 A | * | 7/1990 | Breton et al. | 250/310 |
| 4,967,088 A | * | 10/1990 | Stengl et al. | 250/491.1 |
| 4,985,634 A | * | 1/1991 | Stengl et al. | 250/492.2 |
| 5,389,954 A | * | 2/1995 | Inaba et al. | 347/258 |
| 5,627,373 A | * | 5/1997 | Keese | 250/310 |
| 6,000,800 A | * | 12/1999 | Webb et al. | 351/211 |
| 6,067,153 A | * | 5/2000 | Mizuno | 356/237.2 |
| 6,426,501 B1 | * | 7/2002 | Nakagawa | 250/310 |
| 6,433,348 B1 | * | 8/2002 | Abboud et al. | 250/492.22 |
| 6,465,781 B1 | * | 10/2002 | Nishimura et al. | 250/306 |
| 2002/0028399 A1 | * | 3/2002 | Nakasuji et al. | 430/30 |
| 2002/0130262 A1 | * | 9/2002 | Nakasuji et al. | 250/311 |
| 2002/0148975 A1 | * | 10/2002 | Kimba et al. | 250/492.1 |

FOREIGN PATENT DOCUMENTS

JP 10199780 A * 7/1998 ......... H01L/21/027

* cited by examiner

Primary Examiner—John R. Lee
Assistant Examiner—Bernard E. Souw
(74) Attorney, Agent, or Firm—McGinn & Gibb, PLLC

(57) ABSTRACT

An electron beam apparatus for irradiating a target with an electron beam includes a reference sample including at least one reference pattern which has a plurality of lattice structures arranged along the circumference of a circle in a evaluation surface of the reference sample; and an adjustment section for adjusting the electron beam by irradiating the evaluation surface with the electron beam on the basis of electrons generated from the reference sample.

10 Claims, 18 Drawing Sheets

WITHOUT DEFOCUSING AND ASTIGMATISM

OUT-OF-FOCUS

ASTIGMATISM

Fig.16

| DIAMETER OF CIRCLE (μm) | TYPE OF L&S | SIDE (μm) | | Line / Space (nm) | NUMBER OF LINES |
|---|---|---|---|---|---|
| | | a | b | | |
| φ5 | A | 1 | 0.75 | 50 / 50 | 10 |
| φ8 | B | 1.6 | 1.2 | 80 / 80 | 10 |
| φ12.5 | C | 2.5 | 1.9 | 125 / 125 | 10 |
| φ20 | D | 4 | 3 | 200 / 200 | 10 |

ELECTRON BEAM APPARATUS AND ELECTRON BEAM ADJUSTING METHOD

BACKGROUND OF THE INVENTION

1. Field of the Invention

The present invention relates to an electron beam apparatus and an electron beam adjusting method for adjusting an electron beam into a desired shape to be irradiated on a target.

2. Description of the Related Art

An electron beam apparatus using an electron beam is widely applied to manufacturing apparatuses such as an electron beam drawing apparatus in the semiconductor device manufacture, and a measuring apparatus such as an electron microscope, since a beam spot diameter can be adjusted to be extremely small. Also, development is now under progress to an application of the electron beam apparatus to a mastering apparatus for a large capacity disc such as a digital versatile disc (DVD), a hard disk drive for magnetic recording, and the like. The electron beam apparatuses are widely used in measuring apparatuses such as a scanning electron microscope (SEM) and evaluation apparatuses.

For example, in a mastering apparatus for manufacturing a master disc of the DVD disc and the like, the accuracy of widths of pits and grooves to be recorded (i.e., cut) is critical, so that the diameter of a recording beam must be precisely controlled for achieving a high accuracy. While an electron beam cylinder or column of the electron beam apparatus is designed to provide a predetermined beam diameter, a precise adjustment is required for an optical axis (electron beam axis) for achieving the design performance. For this reason, the beam diameter is typically measured before starting the recording and adjusted to fall within a predetermined range of values.

As described above, the beam diameter, aberration and focus must be accurately evaluated and adjusted for achieving a high accuracy in the electron beam apparatus. The beam diameter can be measured, for example, by observing a sample having a miniature structure using a SEM function of the electron beam apparatus, and estimating the beam diameter from the resolution of a SEM image of the sample. However, the measurement is problematic in reproducibility due to arbitrariness in adjustments of contrast and brightness of a SEM image display system. Therefore, though used in research applications, an application to manufacturing apparatuses and the like still includes problems.

The beam diameter may be measured by another method which uses an edge signal. More specifically, a beam is one-dimensionally scanned on a sample which has a vertical and smooth edge, and the beam diameter can be evaluated using a change in the intensity of a detection signal generated near the edge. While several methods are available for detecting means, the most successful one is a knife-edge method which uses a sample made of silicon or the like and having a hole extending therethrough or a cross wire and measures a change in the intensity of a current which reaches a lower part thereof. Specifically, a beam irradiated vertically to a knife edge (for example, a cross wire such as a tungsten wire) is scanned to measure the waveform of a current which reaches a lower part of the knife edge. The beam diameter is calculated from a rising time of a step-shaped signal waveform, and a scanning speed. Actually, however, this method suffers from an insufficient S/N (signal/noise) ratio of the detection signal which largely fluctuates due to noise. For a more accurate measurement, the waveform of the current must be measured a plurality of times for averaging, however, a long time is required for achieving an accurate measurement.

The foregoing method uses a sample having edges orthogonal to each other (along an x-axis and a y-axis, respectively), scans a beam vertically to the edge in the y-direction to evaluate the beam diameter in the x-direction, and similarly scans the beam vertically to the edge in the x-direction to evaluate the beam diameter in the y-direction.

However, in the evaluation of the beam diameter in the orthogonal directions, aberration symmetric about the axis cannot be separated from aberration asymmetric about the axis. In addition, defocusing (i.e., out-of-focus) cannot be separated from aberration. For example, as shown in FIG. 1, the beam diameter (profile) is extended so that a measured value appears large due to both edge signals in the directions orthogonal to each other (x- and y-directions) when the beam is out of focus (FIG. 1B) as compared with when the beam is focused without astigmatism (FIG. 1A). Likewise, when there is astigmatism asymmetric about the axis (for example, the beam extends at an angle of 45° from the x-axis or y-axis, as shown in FIG. 1C), the beam diameters in the x- and y-directions are likewise observed to be large, so that a large measured value is generated from the edge signal. For this reason, it is not possible to determine from the measured values of the beam diameters in the x- and y-directions whether to make adjustment for either of defocusing or astigmatism. Also, as described above, for finding a precise beam diameter, the measurements must be repeated a proper number of times for averaging, giving rise to a problem that a long time is required therefor.

OBJECT AND SUMMARY OF THE INVENTION

The present invention has been made in view of the foregoing problems, and it is an object of the present invention to provide an electron beam apparatus and an electron beam adjusting method which are capable of accurately and rapidly adjusting the focus and aberration of an electron beam.

To achieve the object, according to one aspect of the present invention, there is provided an electron beam apparatus for irradiating a target with an electron beam, comprising a reference sample including at least one reference pattern which has a plurality of lattice structures arranged along the circumference of a circle in a evaluation surface of the reference sample; and an adjustment section for adjusting the electron beam by irradiating the evaluation surface with the electron beam on the basis of electrons generated from the reference sample.

To achieve the object, according to another aspect of the present invention, there is provided a method of adjusting an electron beam for irradiation of a target, comprising the steps of providing a reference sample including at least one reference pattern which has a plurality of lattice structures arranged along the circumference of a circle in a evaluation surface of the reference sample; scanning the electron beam on the plurality of lattice structures within the same reference pattern; converting a change in electrons caused by the scanning operation into an electric signal; and comparing a plurality of waveform blocks corresponding to the respective lattice structures within the electric signal to adjust the electron beam such that the waveform blocks become uniform.

BRIEF DESCRIPTION OF THE DRAWINGS

FIG. 16 is a diagram showing the shape of the line-and-space shown in FIG. 15;

DETAILED DESCRIPTION OF THE PREFERRED EMBODIMENTS

Figure 1A:
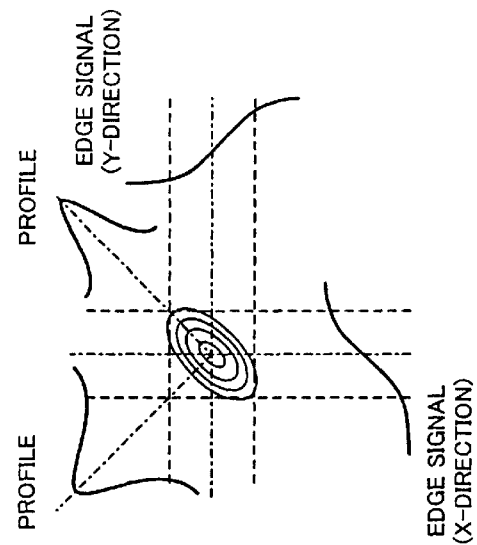
FIGS. 1A–1C are diagrams showing beam profiles and edge signals affected by defocusing and astigmatism.
Figure 1B:
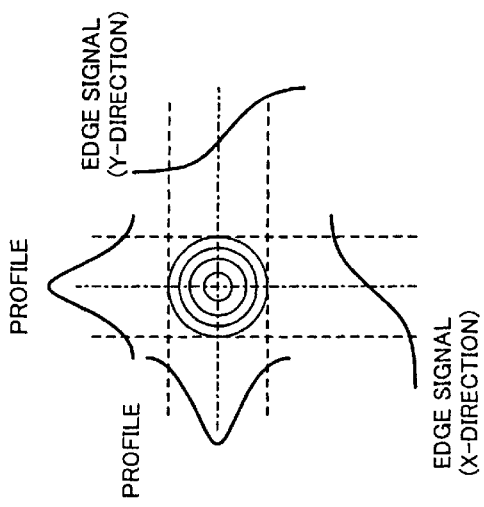
Figure 1C:
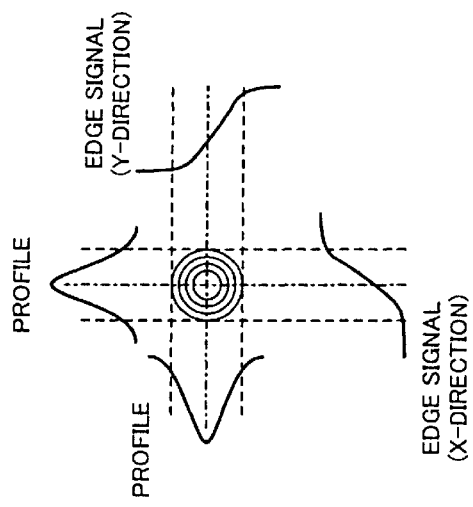

Embodiments of the present invention will be described in detail with reference to the drawings. In the drawings used in the following description, substantially equivalent elements are designated the same reference numerals.

First Embodiment

Figure 2:
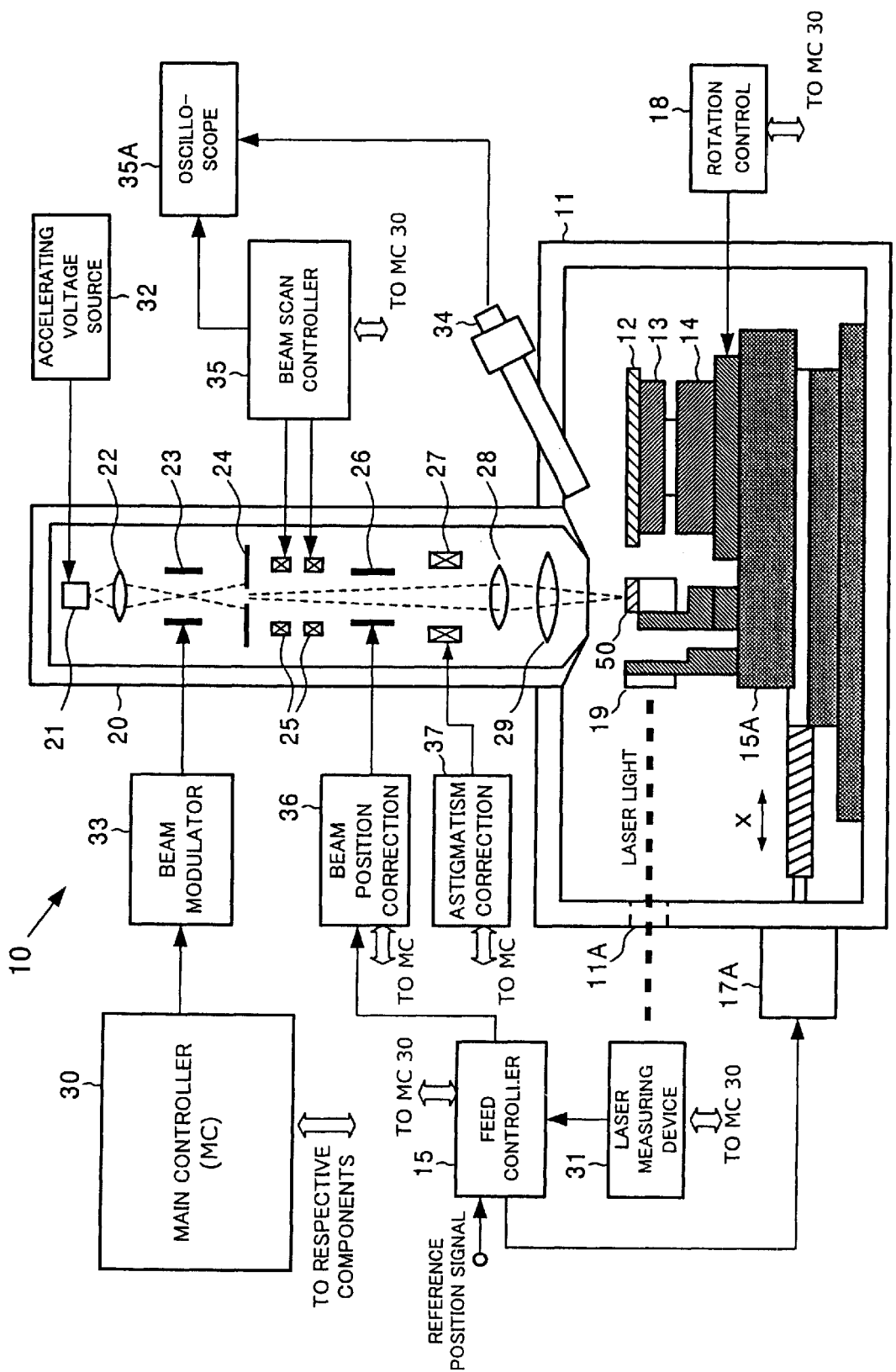
FIG. 2 is a cross-sectional view of a disc mastering apparatus to which an electron beam apparatus according to one embodiment of the present invention is applied.
Figure 3:
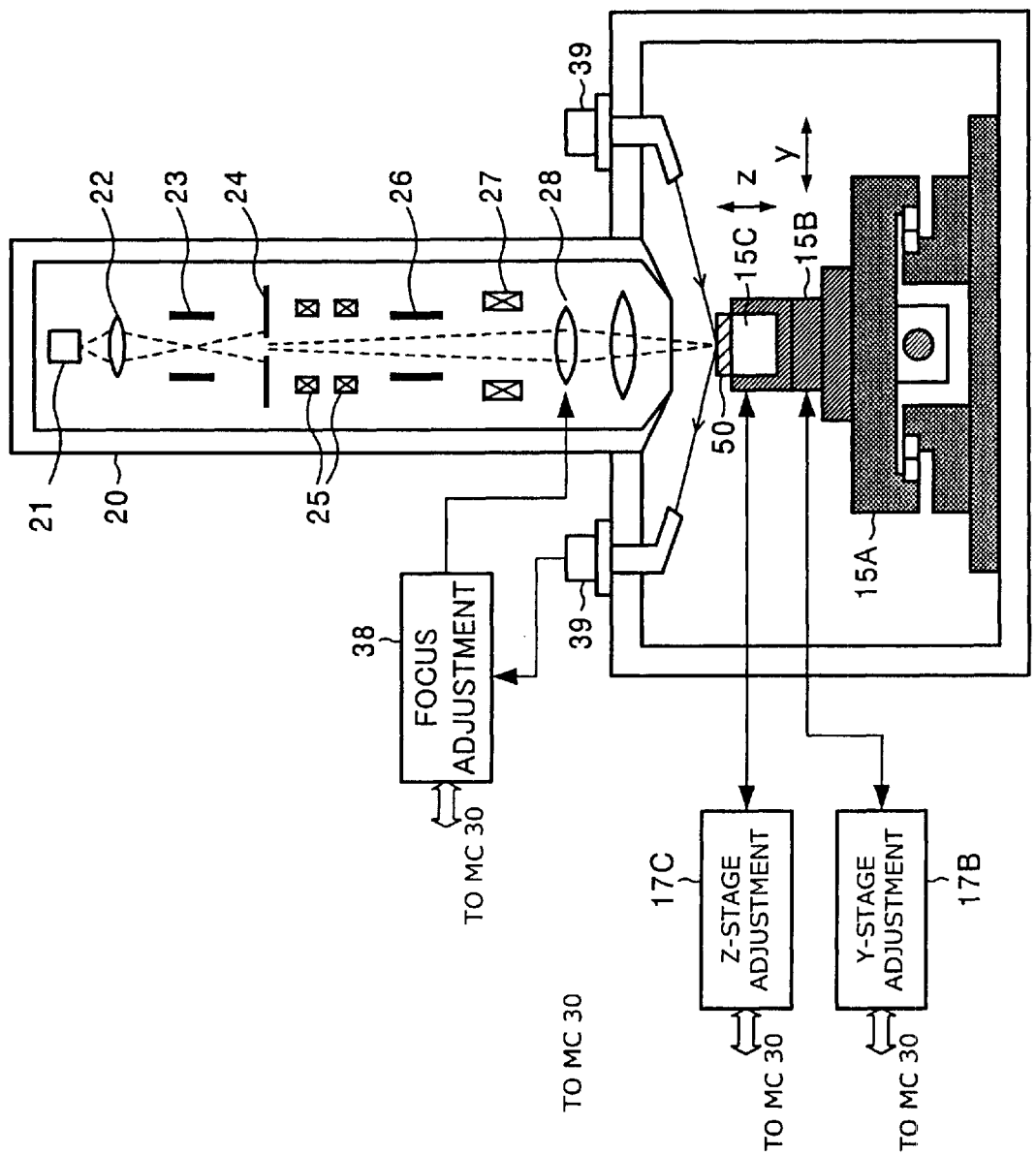
FIG. 3 is a cross-sectional view of the disc mastering apparatus in a direction perpendicular to the cross-section shown in FIG. 2.

FIG. 2 is a cross-sectional view of a disc mastering apparatus 10 for manufacturing a master disc to which an electron beam apparatus according to one embodiment of the present invention is applied. FIG. 3 is a cross-sectional view taken in a direction perpendicular to the cross-section shown in FIG. 2. The electron beam apparatus according to the present invention is configured as a part of the mastering apparatus 10 for manufacturing a master disc(or stamper) for an optical disc, a magnetic disc and the like. The following description will be made on an apparatus for manufacturing an optical master disc. An outline of an optical disc stamper manufacturing process will be described below in brief.

A silicon (Si) substrate, for example, is used for manufacturing an optical master disc. The silicon substrate is coated with an electron beam resist on the main surface. The substrate coated with the electron beam resist is rotated and irradiated with an electron beam, which is modulated by an information data signal, within an optical master disc manufacturing apparatus to spirally form a latent image of a miniature concave/convex pattern such as pits and grooves.

After termination of electron beam exposure, the substrate is removed from the optical master disc manufacturing apparatus for developing the resist. The resist is removed after patterning process, resulting in the miniature convex/concave pattern formed on the substrate. The surface of the substrate formed with the pattern is formed with a conductive film, and plated to complete an optical master disc (or stamper).

As shown in FIGS. 2 and 3, the master disc manufacturing apparatus 10 has a vacuum chamber 11, and an electron beam emitter (electron column) 20 attached to the vacuum chamber 11. The vacuum chamber 11 contains a master disc substrate (hereinafter, referred to as the "disc substrate") 12 as a target; a turntable 13 for carrying the disc substrate 12 thereon; and a spindle motor 14 for rotating the turntable 13. A rotation controller 18 controls the rotational speed of the spindle motor 14. The disc substrate 12, turntable 13, and spindle motor 14 are carried on a stage 15A movable in a predetermined direction (x-direction) by a feed motor 17A (hereinafter, referred to as the "X-stage"). A feed controller 15 controls the position in the x-direction of the feed motor 17A.

A stage 15B movable in the horizontal direction (y-direction) in a plane perpendicular to the x-direction (hereinafter, referred to as the "Y-stage") is provided on the X-stage 15A, and a stage 15C movable in the normal direction (i.e., z-direction) in a plane perpendicular to the x-direction (hereinafter, referred to as the "Z-stage") is provided on the Y-stage 15B. Driving units (not shown), such as stepping motors, are attached to the Y-stage 15B and the Z-stage 15C, so that the positions of the stages can be adjusted by adjusting signals from a Y-stage adjusting circuit 17B and a Z-stage adjusting circuit 17C, respectively. An evaluation reference sample (hereinafter, referred to as a "reference sample") 50 for adjusting an electron beam, later described in detail, is held on the Z-stage 15C. FIGS. 2 and 3 show the arrangement for adjusting the electron beam. Specifically, these figures show that the X-stage 15A has been positioned such that the reference sample 50 is irradiated with the electron beam.

A reflector 19 is provided on the X-stage 15A for reflecting laser light for measurement from the outside of the vacuum chamber 11. The laser light for measurement is emitted from a laser distance-measuring device 31 (hereinafter, simply referred to as a "laser measuring device"), and reflected by the reflector 19 through a window 11A of the vacuum chamber 11. The reflected light is received by the laser measuring device 31 through the window 11A to measure the position of the X-stage 15A. A position signal measured by the laser measuring device 31 is supplied to the feed controller 15. The feed controller 15 compares the measured position signal with a reference position signal to control the position of the X-stage 15A under control of a main controller 30. The controller 15, the rotation controller 18, the adjusting circuits 17B, 17C, and a variety of components, later described, operate under control of the main controller 30.

The electron beam emitter 20 for emitting an electron beam will be described. The electron beam emitter 20 comprises an electron gun 21, a converging lens 22, blanking electrodes 23, an aperture 24, an XY scanning beam deflector 25, a beam position correction beam deflector 26, an astigmatism corrector 27, a focus lens 28, and an objective lens 29 arranged in this order.

The electron gun 21 is supplied with a high voltage from an acceleration voltage source 32 and emits an electron beam which is accelerated to several tens of KeV. The converging lens 22 converges an emitted electron beam, and leads the converged beam to the aperture 24. A beam modulator 33 drives the blanking electrodes 23 to control the electron beam between ON and OFF operation under control of the main controller 30. Specifically, the blanking electrodes 23 are applied with a voltage to largely deflect the electron beam passing therethrough to block the electron beam from passing the aperture 24, so that the electron beam can be turned off.

A beam scan controller 35 is a so-called television scan system which drives the XY scan beam deflector 25 for beam scanning and the like, as will be described later in detail.

A beam position correcting circuit 36 drives the beam position correction beam deflector 26 based on a position error signal from the feed controller 15 to correct the position of the beam. An astigmatism correcting circuit 37 drives the astigmatism corrector 27 to correct astigmatism under control of the main controller 30.

The vacuum chamber 11 is provided with a level measuring device 39 for detecting the level of the main surface of the disc substrate 12. The level measuring device 39, which includes, for example, a position sensor, a CCD (Charge Coupled Device), and the like, receives a light beam reflected on the surface of the disc substrate 12 to detect the level of the main surface of the disc substrate 12 based on a signal indicative of the received light. The level measuring device 39 supplies a level detection signal to a focus adjusting circuit 38. The focus adjusting circuit 38 adjusts the focus of the electron beam irradiated to the main surface of the disc substrate 15 based on the level detection signal.

The vacuum chamber 11 is also provided with an electron detector 34 for detecting secondary electrons emitted from an object irradiated with the electron beam, such as the reference sample 50, or reflected electrons reflected from the object irradiated with the electron beam.

The vacuum chamber 11 is installed through an antivibration base (not shown) such as an air damper to prevent external vibrations. A vacuum pump (not shown) is connected to the vacuum chamber 11 to exhaust the chamber 11 such that a vacuum atmosphere prevails within the chamber 11 at a predetermined pressure.

Figure 4:
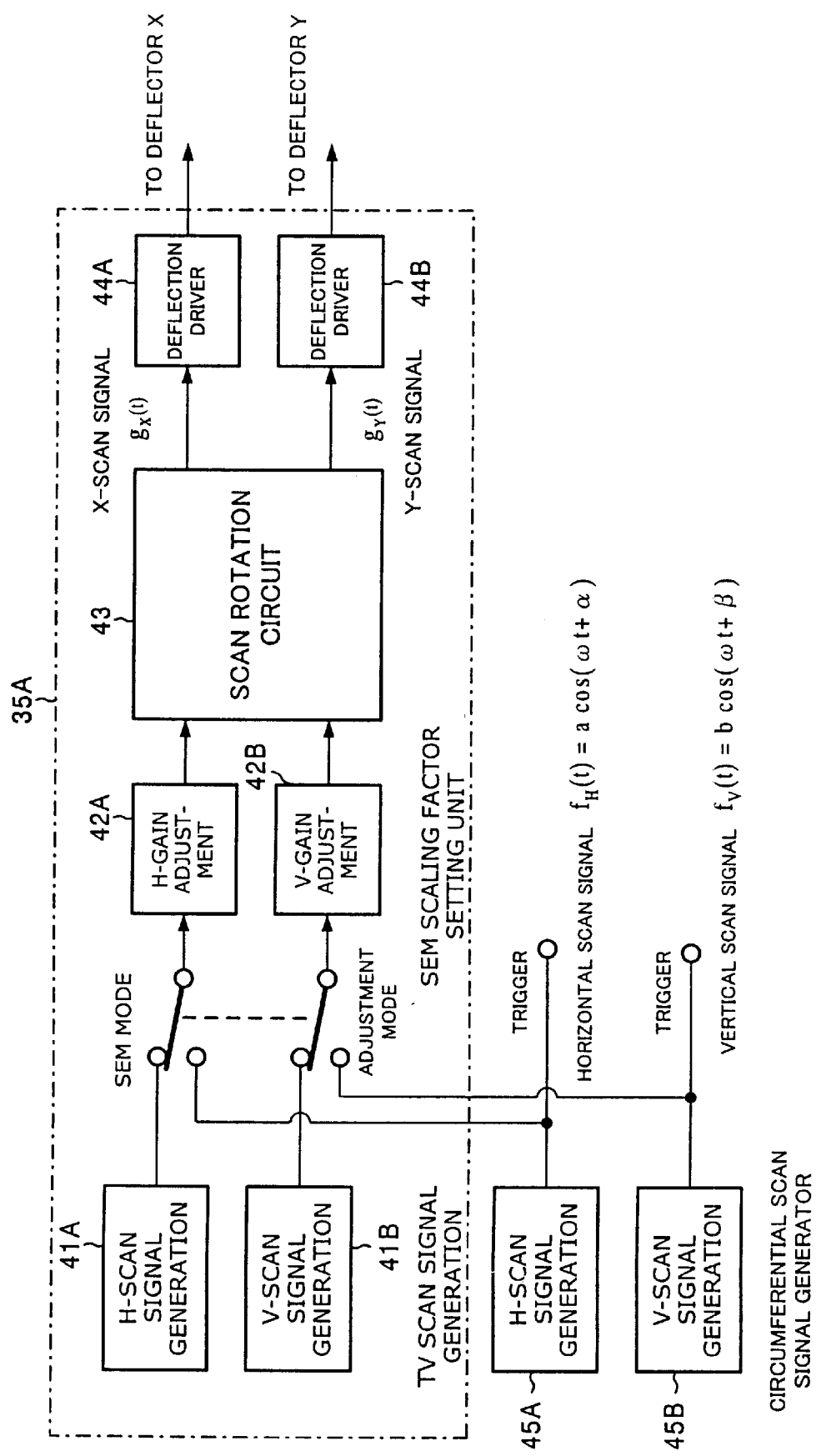
FIG. 4 is a block diagram showing the configuration of a beam scan controller.

FIG. 4 is a block diagram showing the configuration of the beam scan controller 35. A section 35A (surrounded by a one-dot-chain line) indicates a television scan system used in a typical SEM apparatus. The section 35A has an SEM scaling factor adjusting unit comprised of horizontal/vertical scan signal generator circuits 41A, 41B, and horizontal/vertical gain adjusting circuits 42A, 42B; a scan rotation circuit 43 for rotating a SEM image; and deflection driver circuits 44A, 44B.

The beam scan controller 35 further has circumferential scan signal generator circuits 45A, 45B for scanning the electron beam along a circumference of a circle. General equations of a horizontal scan signal $f_H(t)$ and a vertical scan signal $f_V(t)$ for drawing a Lissajous trajectory by a horizontal scan and a vertical scan of the electron beam are expressed by:

$$f_H(t)=a \cos(\omega t+\alpha)$$

$$f_V(t)=b \cos(\omega t+\alpha)$$

The condition for scanning the electron beam along a circumference of the circle is expressed by:

$$b=a, \text{ and } \beta=\alpha\pm(\pi/2)$$

Figure 5:
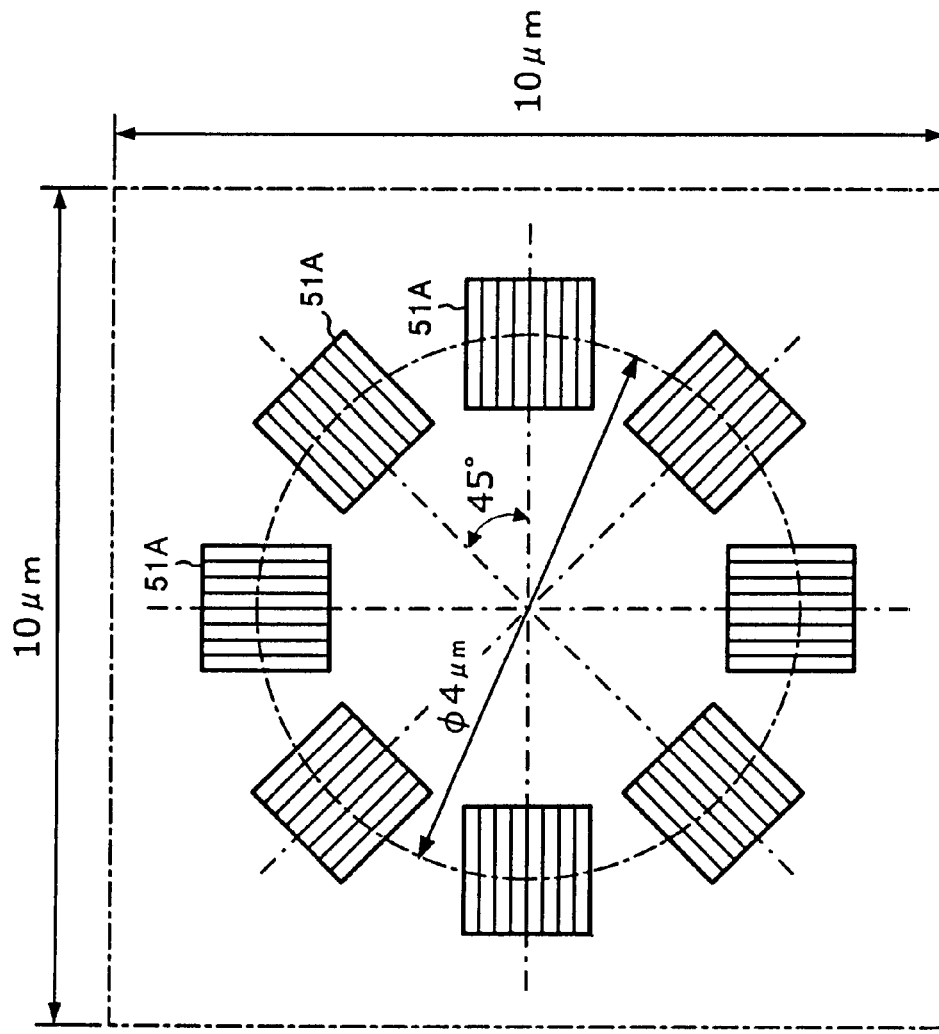
FIG. 5 is a diagram schematically showing the configuration of a cell in a first embodiment of the present invention.

In the following, the configuration of the reference sample 50 used for adjusting the electron beam will be described in detail. An evaluation surface of the reference sample 50 irradiated with the electron beam has the shape of a square, one side of which is approximately ten millimeters (mm). A plurality of cells 51, basic test patterns, are arranged on the evaluation surface. As shown in FIG. 5, the cell 51 has a square cell area, one side of which is ten micrometers ($\mu$m), and a plurality of lattice structures each comprised of lines and spaces (hereinafter, simply referred to as the "line-and-space (L&S)) 51A are formed within the cell area. More specifically, eight line-and-spaces 51A are substantially radially arranged at angular intervals of 45° along the circumference of a circle having the radius of 2 $\mu$m within the cell area. In other words, each line-and-space 51A is radially arranged such that the eight identical structures are rotated around the circle (i.e., eight-folded radial symmetry).

Figure 6:
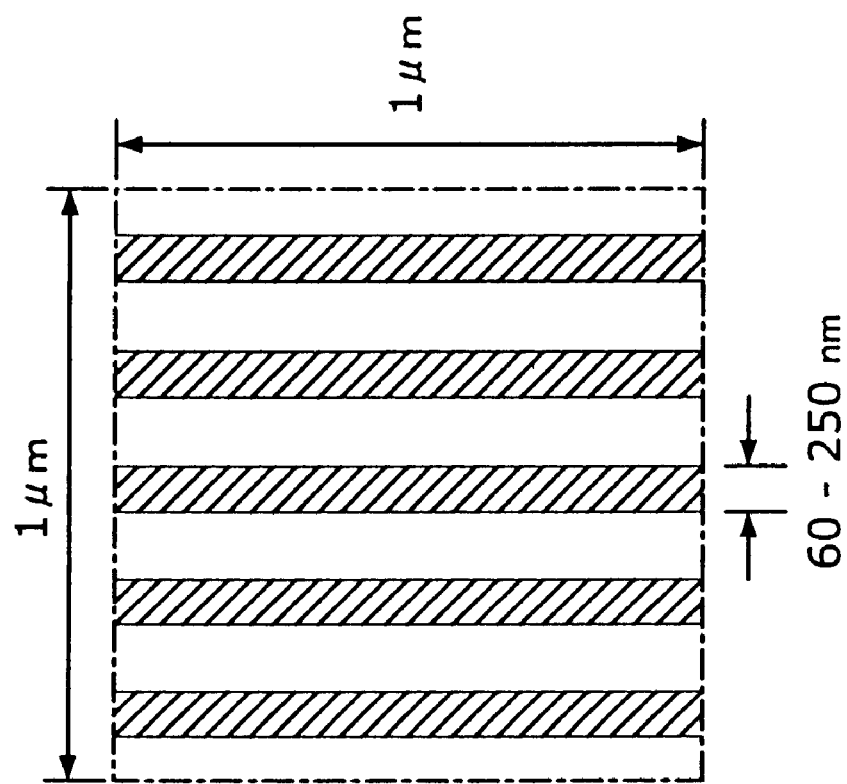
FIG. 6 is an enlarged view of a line-and-space within the cell shown in FIG. 5.

FIG. 6 is an enlarge view of the line-and-space 51A. The line-and-space 51A has the shape of a square, one side of which is, for example, 1 $\mu$m, and is comprised of lines and spaces arranged at regular intervals. While each line-and-space 51A within the same cell has the same widths of lines and spaces, a plurality of line-and-spaces having different widths of lines and spaces may be formed within the same cell, as will be later described in detail.

Figure 7:
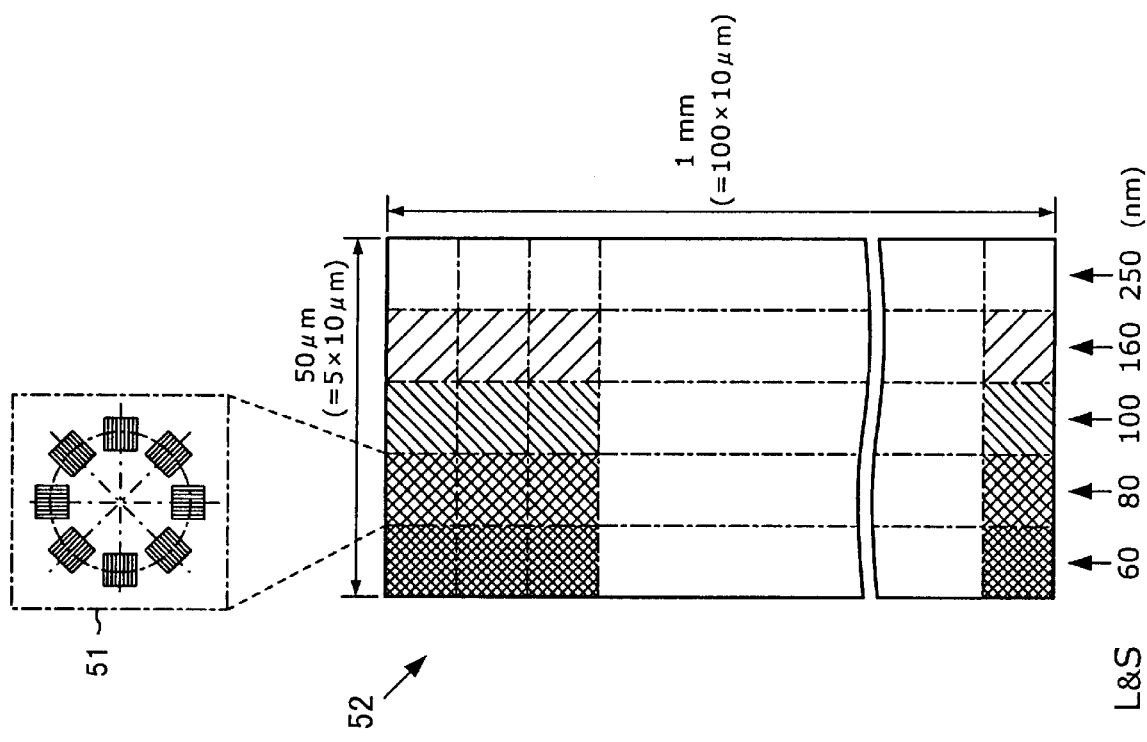
FIG. 7 is a diagram schematically showing the configuration of a strip having arranged thereon a plurality of cells which have different line-and-spaces.

In this embodiment, a plurality of cells having the line-and-spaces 51A with different line widths and space widths are arranged on the reference sample 50. As mentioned above, the respective line-and-spaces 51A within a cell have the same line width and space width. As shown in FIG. 7, cells having the line-and-spaces 51A with the line widths (space widths) chosen to be 60, 80, 100, 160, 250 nanometers (nm) are arranged horizontally in a line. This pattern is repeated 100 times in the vertical direction to provide 5×100 cells. Therefore, this configuration (hereinafter, referred to as the "strip") has the size of 50 $\mu$m horizontal and 1 mm vertical.

Figure 8:
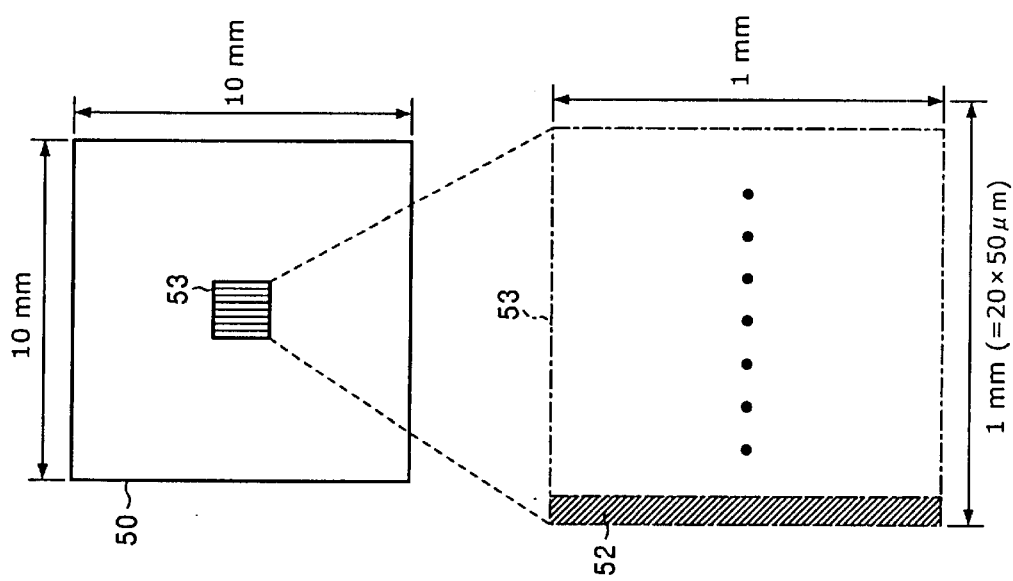
FIG. 8 is a diagram schematically showing the configuration of a field comprised of a plurality of strips.

As shown in FIG. 8, a field 53 is comprised of 20 strips 52 arranged side by side. Specifically, the field 53 has the shape of a square, one side of which is 1 mm. The reference sample 50 is created by forming the field 53 on the evaluation surface.

In the following, an electron beam adjusting operation will be described in detail with reference to flow charts of FIGS. 9 and 10. The adjusting operation is performed under control of the main controller 30.

Figure 11:
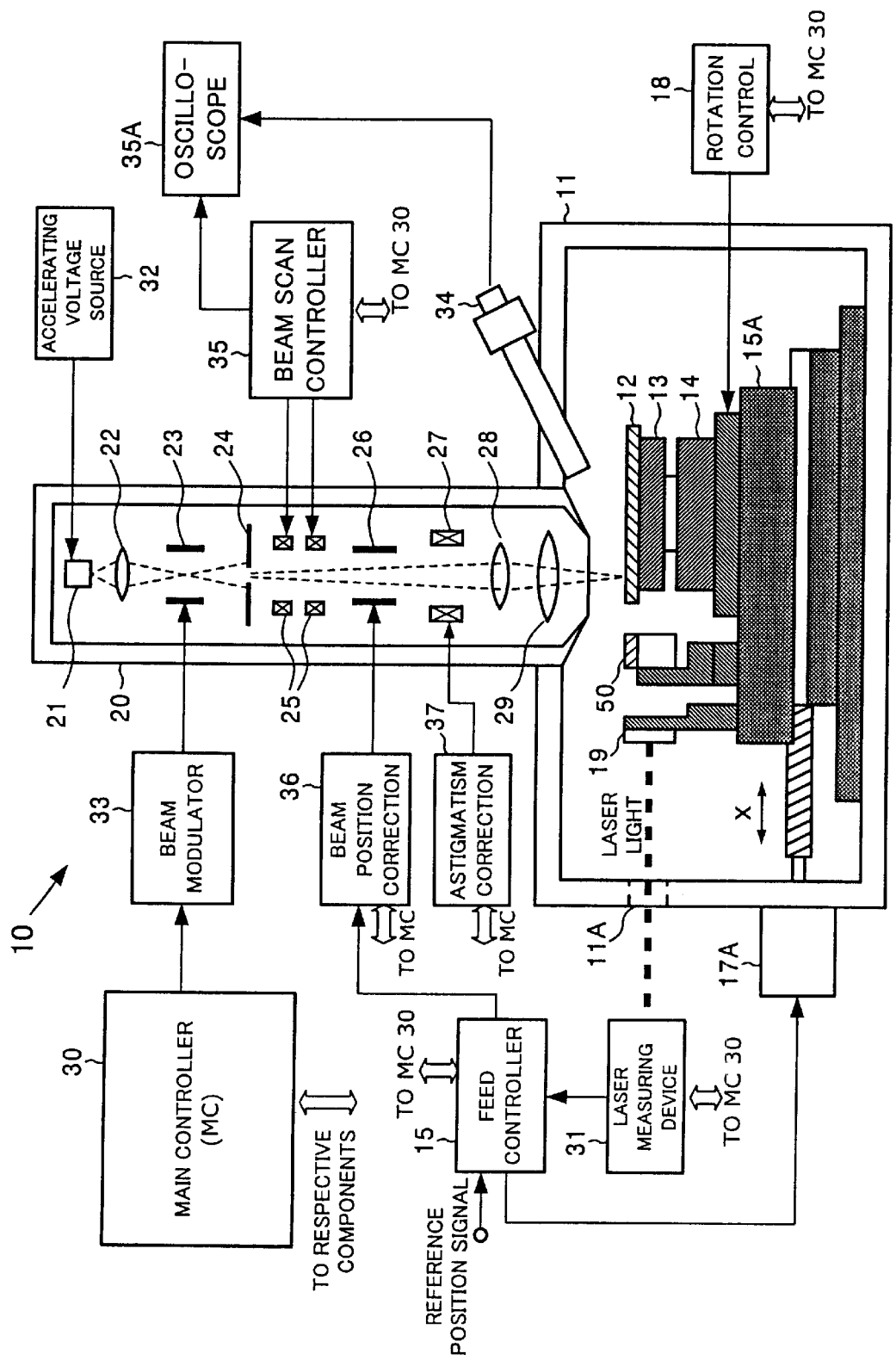
FIG. 11 is a cross-sectional view showing a placement when an electron beam is irradiated to a predetermined position on a disc substrate, for example, near the outer periphery.
Figure 12:
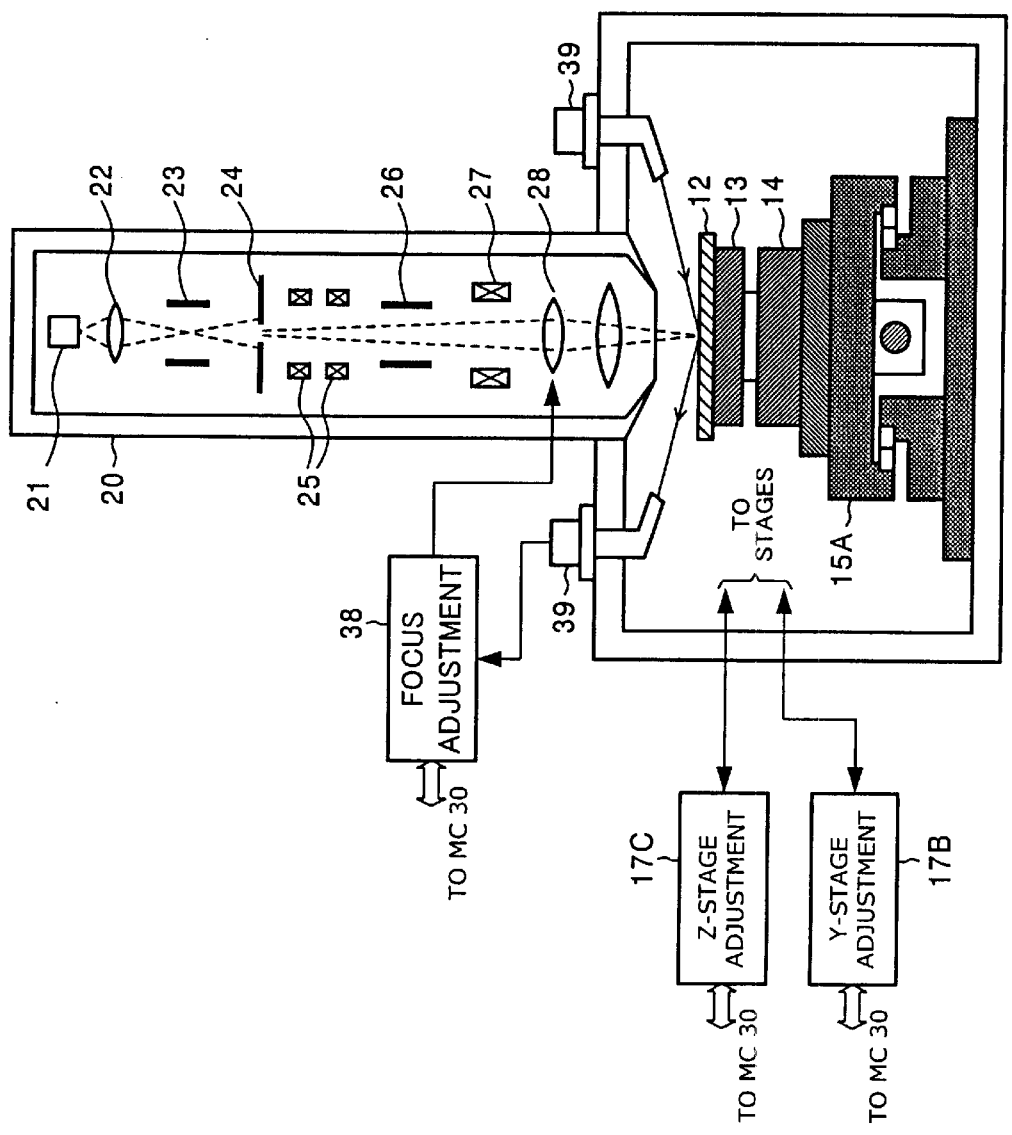
FIG. 12 is a cross-sectional view taken in a direction perpendicular to the cross-section shown in FIG. 11.

A disc substrate 12 for recording is carried on the turntable 13. The X-stage 15A is moved, and the Y-stage 15B and Z-stage 15C are also moved if necessary, for adjustment to irradiate the electron beam to a predetermined position, for example, near the outer periphery of the disc substrate 12. FIGS. 11 and 12 show the arrangement in this event in cross-sectional views. After completion of adjustment, the disc substrate 12 is rotated at a predetermined speed (step S11). Then, the level measuring device 39 measures fluctuations in the level of the recording surface during the rotation to calculate an average level (step S12).

The X-stage 15A is adjusted to move the reference sample 50 for adjustment of the electron beam diameter to the position which is irradiated with the electron beam, as shown in FIGS. 2 and 3 (step S13). The beam scan controller 35 is switched to a SEM mode to adjust the position such that the center of the screen matches the center of the sample (step S14). The Z-stage 15C is adjusted such that the level of the sample surface matches the average level of the recording surface measured at step S11 (step S15). It is determined wither or not the center of the screen matches the center of the sample, and whether or not the sample surface matches the average of measured levels of the recording surface, that is, whether or not the adjustment is completed (step S16). When it is determined that the adjustment is not completed, control returns to step S14, where the adjustment at step S14 and/or step S15 is repeated.

When it is determined at step S16 that the adjustment is completed, the beam scan controller 35 is changed from the SEM mode to an adjustment mode (step S17). The main controller 30 selects a predetermined cell on the reference sample 50. The main controller 30 rotates (or moves) the spot position of the electron beam along the circumference along which the line-and-spaces 51A of the predetermined cell are arranged to acquire a SEM signal (step S18). Specifically, the electron beam is scanned on the circumference such that it substantially perpendicularly crosses the lines (spaces) of the line-and-spaces 51A.

Figure 13:
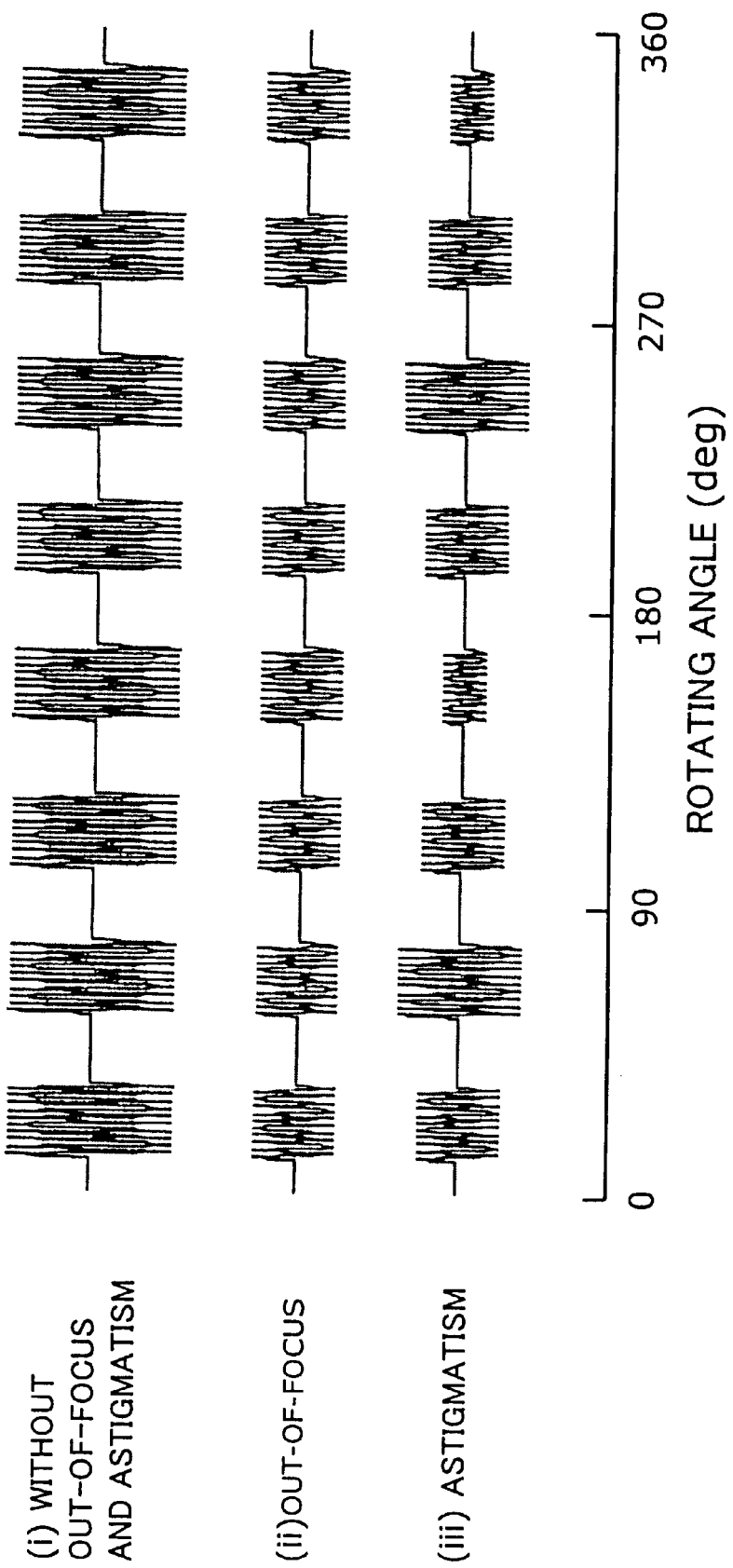
FIG. 13 is a diagram showing SEM signal waveforms (i) when there is no defocusing or astigmatism, (ii) when there is defocusing; and (iii) when there is astigmatism.

The SEM signal generated when the electron beam is rotated once along the circumference is displayed on an oscilloscope. FIG. 13 schematically shows the waveform of the SEM signal, i.e., (i) when there is no defocusing and astigmatism; (ii) when there is defocusing; and (iii) when there is astigmatism. When the beam diameter is equal to or smaller than the dimensions of the line-and-spaces, the signal amplitude is maximal. Therefore, the signal amplitude is maximal (i) when there is no defocusing and astigmatism, in which case the signal amplitudes from the respective line-and-spaces 51A are substantially equal. (ii) When there is defocusing, the signal amplitude becomes smaller as the beam diameter is larger than the dimensions of the line-and-spaces. (iii) When there is astigmatism, the signal amplitude from the respective line-and-spaces 51A varies. Therefore, it can be rapidly distinguished and determined from fluctuations in the signal amplitude whether either defocusing or astigmatism, or both should be adjusted.

The main controller 30 determines whether or not the signal level is equal to or larger than a predetermined value and whether or not the difference in signal level between waveform blocks corresponding to the respective line-and-spaces 51A for a rotating angle is equal to or smaller than a predetermined value (step S19). When the signal level equal to or larger than the predetermined value and the difference in signal level smaller than the predetermined value are not satisfied, the main controller 30 adjusts the focus, astigmatism, and/or optical axis (beam axis) based on the detected signal amplitude, as described above (step S20). Subsequently, step S19 is executed. At step S19, when it is determined that the signal level equal to or larger than the predetermined level and that the difference in signal level smaller than the predetermined value are satisfied, it is determined whether or not the line-and-space of the scanned cell is in the smallest cell of the reference sample 50 (step S21). Upon determination of the line-and-space of the smallest cell, control exits this routine. On the other hand, upon determining that it is not the line-and-space of the smallest cell, a cell of a next smaller line-and-space is selected, and in a manner similar to the foregoing, the spot position of the electron beam is moved along the circumference of the cell to acquire a SEM signal (step S22).

Subsequently, the routine returns to step S19 to repeat the foregoing steps to adjust the focus, astigmatism, and beam axis of the electron beam. With the procedure described above, the electron beam can be adjusted in a short time with a high accuracy.

Second Embodiment

In the following, a second embodiment of the present invention will be described. The master disc manufacturing apparatus 10 is similar in configuration to the first embodiment.

Figure 14:
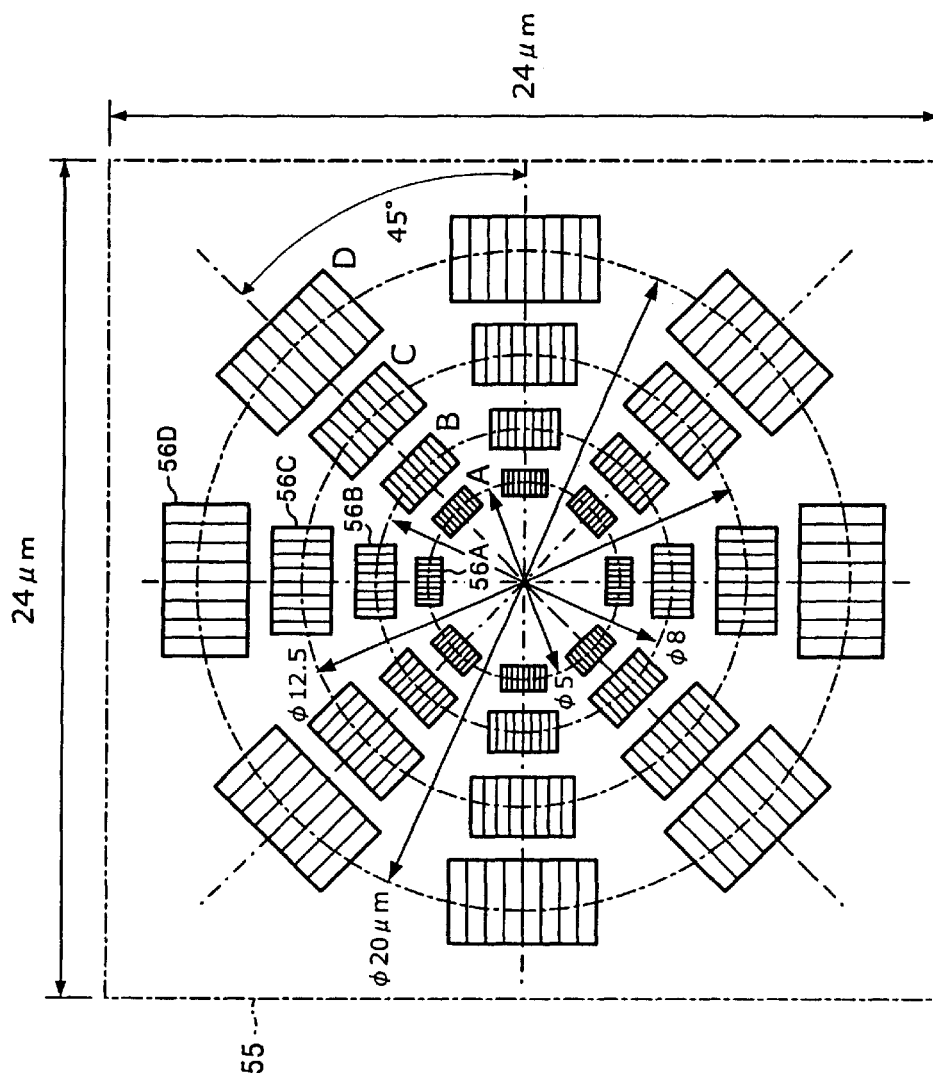
FIG. 14 is a diagram schematically showing the configuration of a cell in a second embodiment of the present invention.
Figure 15:
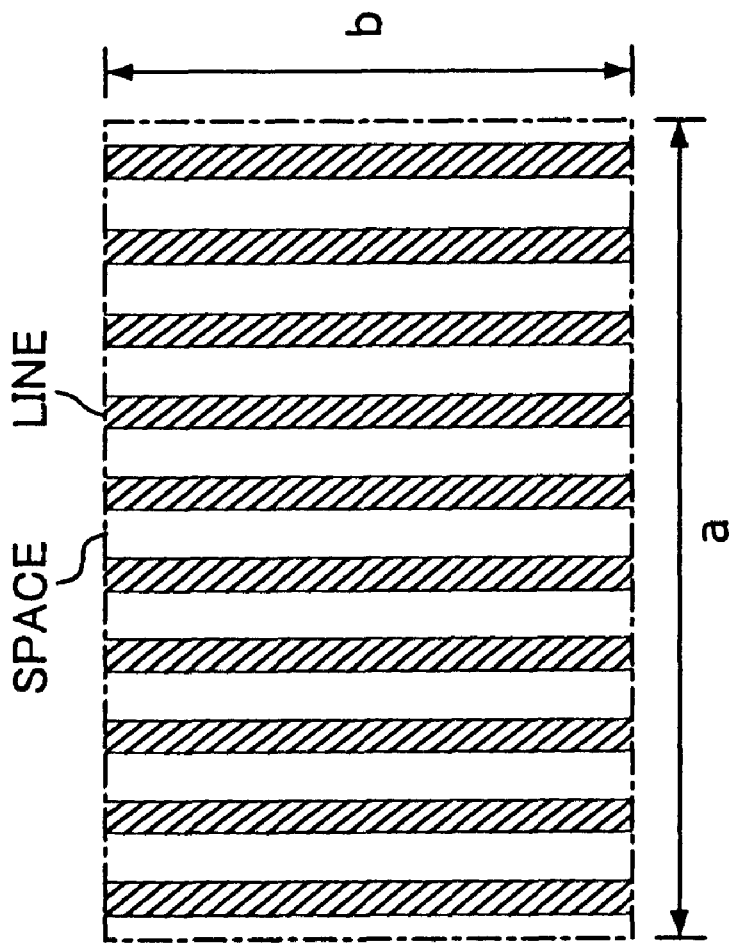
FIG. 15 is a diagram schematically showing a line-and-space in the second embodiment of the present invention.

The configuration of the reference sample 50 in this embodiment will be described in detail. The reference sample 50 has the shape of a square, one side of which is approximately ten millimeters (mm). A plurality of cells 55 are arranged on an evaluation surface of the reference sample 50. As shown in FIG. 14, the cell 55 has a cell area in the shape of a square, one side of which is 24 μm. A plurality of line-and-spaces 56A–56D are formed within the cell area. More specifically, as shown in FIG. 15, the line-and-spaces 56A–56D are each in the shape of a rectangle which has sides (major sides, the length of which is "a") vertical to the lines (spaces), and sides (minor sides, the length of which is "b") parallel with the lines (spaces). As shown in FIG. 14, eight line-and-spaces 56A in the same structure are arranged along the circumference of a circle having the diameter of 5 μm at angular intervals of 45° within the cell area to form a single reference pattern. Similarly, the line-and-spaces 56B–56D are arranged along the circumferences of the circles concentric with the circle of the line-and-space 56A, having the diameters of 8, 12.5, 20 μm, respectively, to form three reference patterns. Each of the line-and-spaces 56A–56D (types A–D, respectively) is comprised of lines and spaces arranged at regular intervals, and the widths of the line and the space vary in accordance with the diameter of the circle, as shown in FIG. 16.

A plurality of cells 55 mentioned above are formed on the reference sample 50. For example, as is the case with the first embodiment, a strip is formed of a plurality of cells 55, and a field is formed of a plurality of strips.

Figure 17:
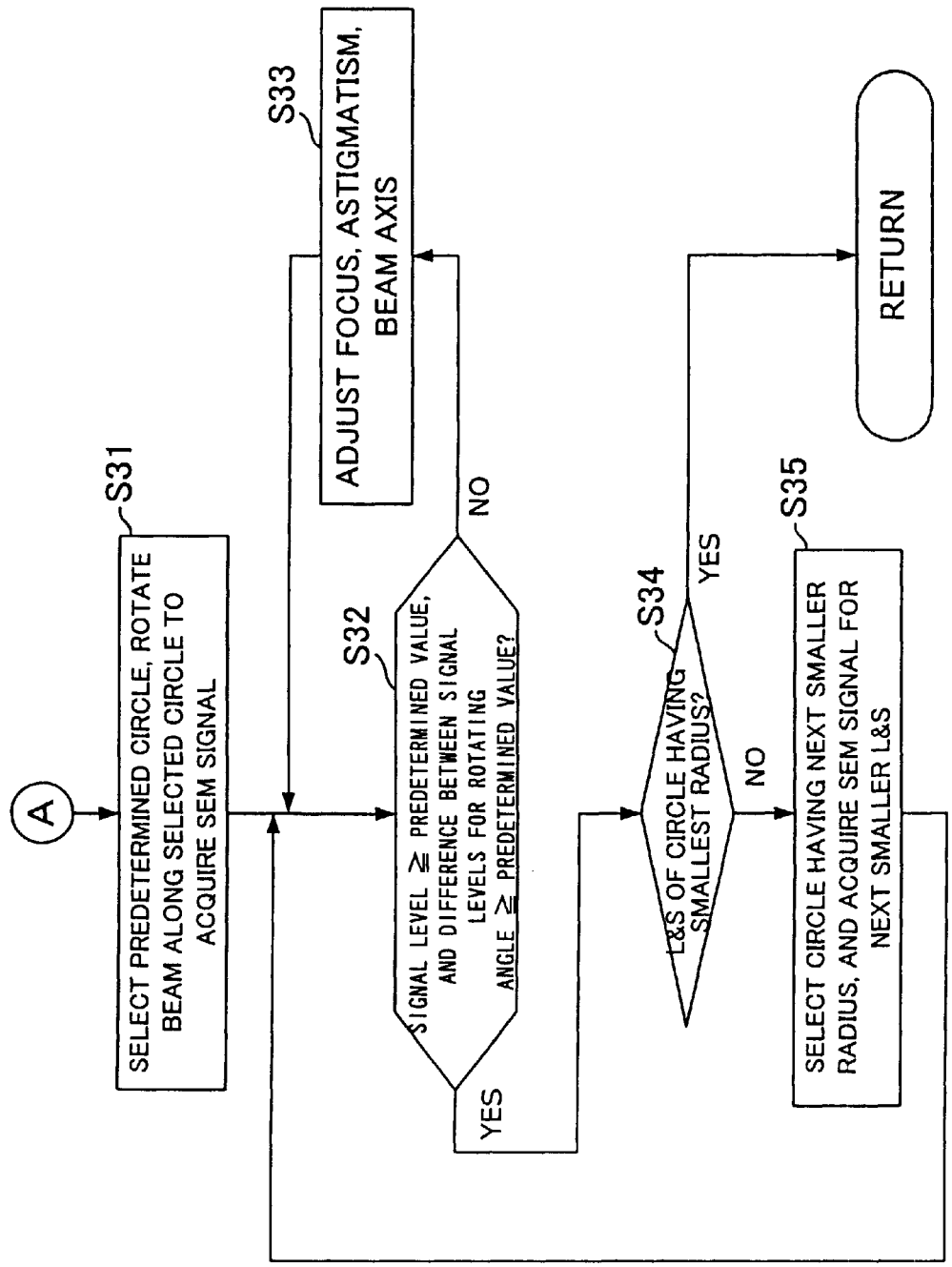
FIG. 17 is a flow chart showing a procedure of an electron beam adjustment operation in the second embodiment of the present invention.

In the following, an electron beam adjusting operation using the reference sample 50 configured in the foregoing manner will be described in detail with reference to flow charts of FIGS. 9 and 17.

Figure 9:
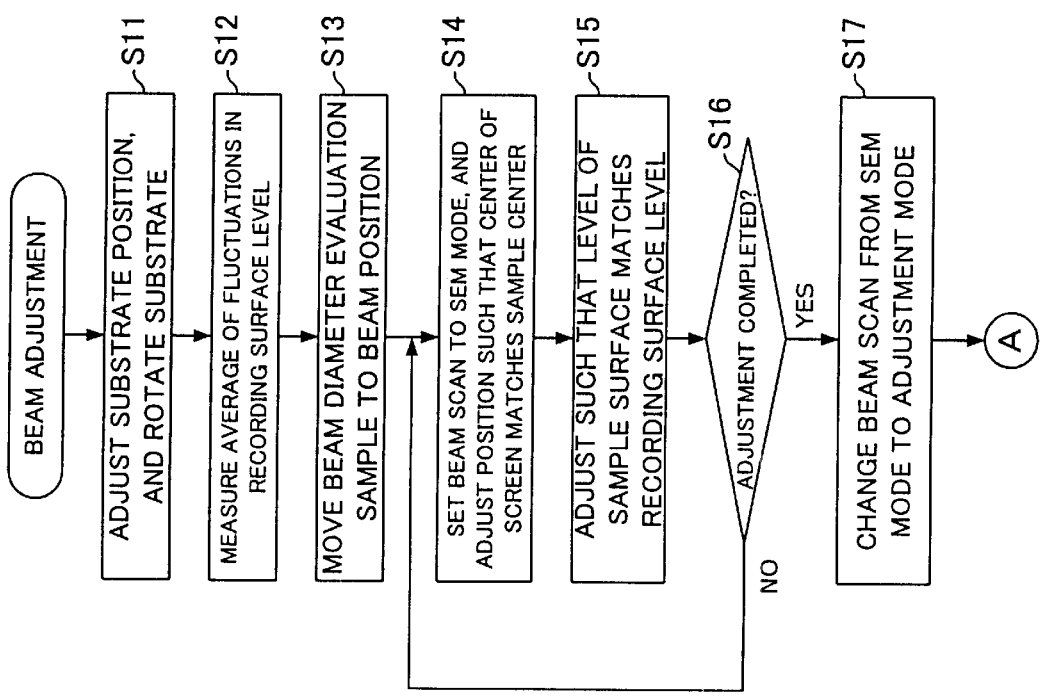
FIG. 9 is a flow chart showing a procedure of an electron beam adjustment operation.
Figure 10:
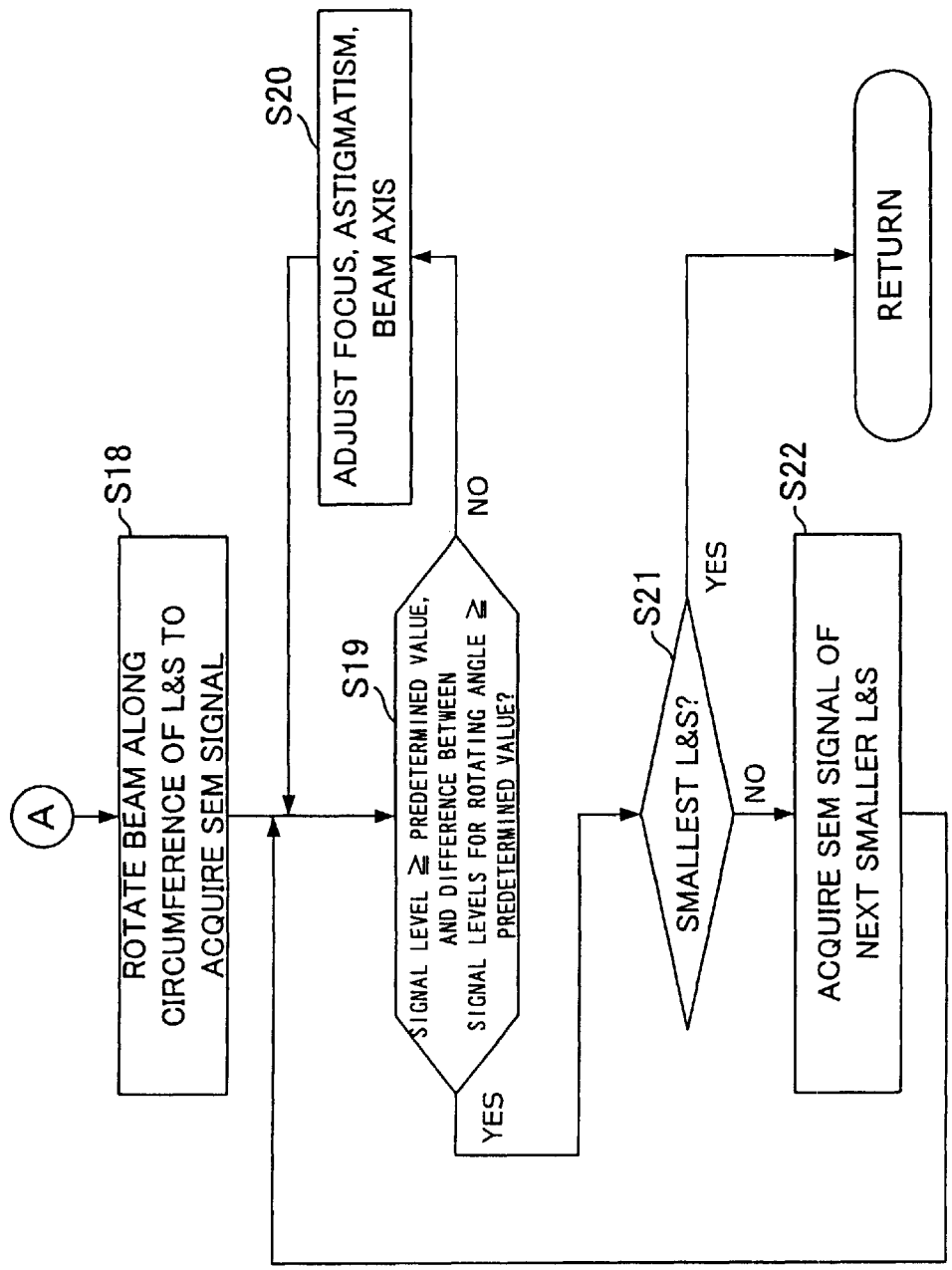
FIG. 10 is a flow chart showing a procedure of an electron beam adjustment operation.

As shown in the flow chart of FIG. 9, steps S11–S17 are executed in a manner similar to the first embodiment.

Then, the main controller 30 selects a predetermined circle (for example, the circle having the largest diameter) within the cell 55, and rotates the beam along the circumference of the selected circle to acquire a SEM signal (step S31). It is determined whether or not the signal level is equal to or larger than a predetermined value and the difference between signal levels from the line-and-spaces for a rotating angle is equal to or smaller than a predetermined value (step S32). When the signal level equal to or larger than the predetermined value and the difference in signal level smaller than the predetermined value are not satisfied, the main controller 30 adjusts the focus, astigmatism and/or optical axis (beam axis) based on fluctuations in a detected signal amplitude (step S33). Subsequently, step S32 is executed. At step 32, when it is determined that the signal level equal to or larger than the predetermined value and the difference in signal level smaller than the predetermined value are satisfied, it is determined whether or not the scanned line-and-space is arranged along the circle having the smallest radius (step S34). Upon determination of the line-and-space arranged along the circle having the smallest radius, the routine is exited. On the other hand, when it is determined that it is not the line-and-space arranged along the circle having the smallest radius, a circle having the next smaller radius is selected, and the spot position of the electron beam is moved along the circumference of the cell, in a manner similar to the above, to acquire a SEM signal (step S35). Subsequently, control returns to step S32 to repeat the foregoing steps to adjust the focus, astigmatism, and beam axis of the electron beam. With the process flow, the electron beam can be adjusted for the aberration and focus in a short time with a high accuracy.

Third Embodiment

In the following, a third embodiment of the present invention will be described. The master disc manufacturing apparatus 10 is identical in configuration to the first embodiment.

Figure 18:
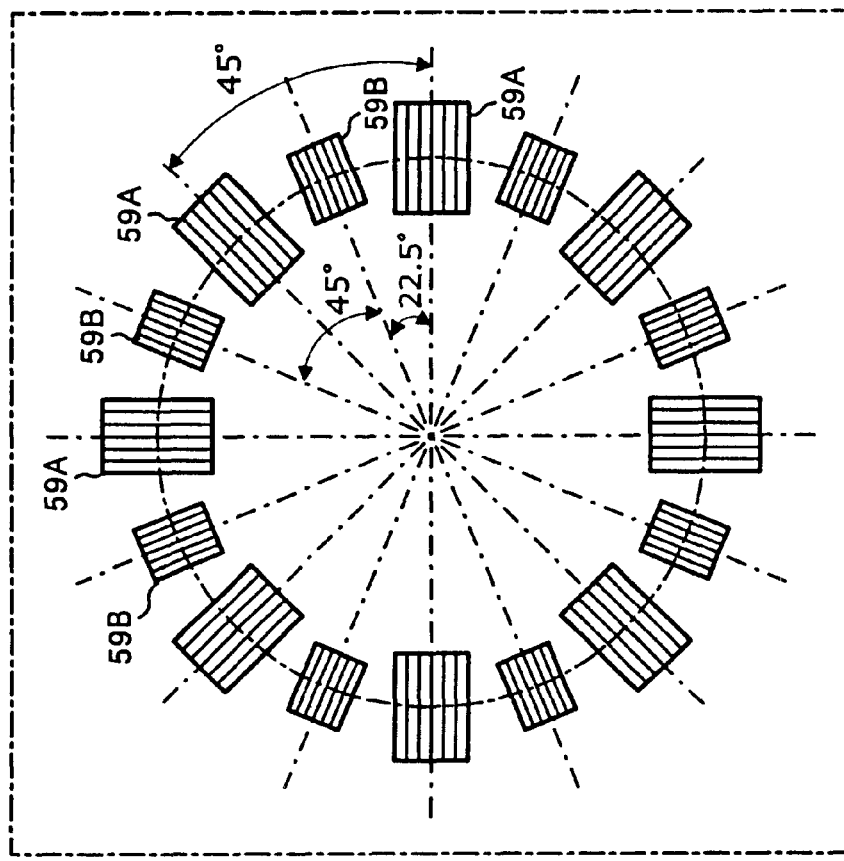
FIG. 18 is a diagram schematically showing the configuration of a cell in a third embodiment of the present invention.

The configuration of the reference sample 50 in this embodiment will be described in detail. A plurality of cells 58 are arranged on an evaluation surface of the reference sample 50. As shown in FIG. 18, eight line-and-spaces 59A in the same structure are arranged within the cell 58 along the circumference of a predetermined circle at angular intervals of 45° to from a single reference pattern. Further, eight line-and-spaces 59B in the same structure, having different dimensions of line-and-spaces from the line-and-space 59A are arranged between the line-and-space 59A along the circumference of the predetermined circle (i.e., shifted from the line-and-space 59A by an angle of 22.5°) to form a single reference pattern. By using this cell configuration, SEM signals can be acquired for two different types of line-and-spaces only by rotating the electron beam once along the circumference. It is therefore possible to rapidly determine from the acquired SEM signals the amounts by which the focus, aberration, and beam axis should be adjusted. Also, in the foregoing signal processing, the electron beam can be more rapidly and accurately adjusted by using an estimation such as interpolation, extrapolation, and the like.

In addition, the same reference sample may be formed with cells similar to this but having different line-and-spaces.

As described above in detail, according to the present invention, it is possible to clearly and rapidly discriminate, for example, a beam profile which is not axially symmetric such as that caused by astigmatism, and a beam profile which is axially symmetric such as that caused by defocusing to accurately adjust the electron beam in a short time.

Numerical values and the like shown in the foregoing embodiments are only illustrative and can be changed as appropriate. Also, an appropriate combination of the foregoing embodiments, and applications of modified embodiments are also within the scope of the present invention.

While the foregoing embodiments have taken an example in which the spot position of the electron beam is moved along the circumference, the beam spot need not be necessarily moved along a true circle, but may be scanned about a single point.

While an optical master disc has been taken as an example of a master disc for the sake of description, the present invention is not limited to the optical master disc but may be applied to apparatuses for manufacturing a magnetic master disc and the like using an electron beam. The present invention may also be applied widely to manufacturing apparatuses such as an electron beam drawing apparatus, and measuring apparatuses such as an electron microscope.

As is apparent from the foregoing, the present invention can realize an electron beam apparatus and an electron beam adjusting method which can accurately adjust an electron beam in a short time.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2001-317137 which is hereby incorporated by reference.

What is claimed is:

1. An electron beam apparatus for irradiating a target with an electron beam, comprising:

a reference sample including at least one reference pattern which has a plurality of lattice structures arranged along the circumference of a circle in a evaluation surface of said reference sample; and an adjustment section for adjusting said electron beam by irradiating said evaluation surface with said electron beam on the basis of electrons generated from said reference sample.

2. An electron beam apparatus according to claim 1, wherein said reference sample including a plurality of the reference patterns, the radii of the reference patterns being different from one another.

3. An electron beam apparatus according to claim 2, wherein at least either one of a line width and a space width of a lattice structure are determined in accordance with the radius of the circle.

4. An electron beam apparatus according to claim 1, wherein said plurality of lattice structures are radially symmetrically arranged.

5. An electron beam apparatus according to claim 1, wherein said reference sample including a plurality of reference patterns, the lattice structures of said plurality of reference patterns arranged on a single circumference, said plurality of reference patterns having different configuration in line and space widths from one another.

6. An electron beam apparatus according to claim 1, wherein the lattice structure is formed using different types of materials.

7. An electron beam apparatus according to claim 1, wherein the lattice structure is formed with a concave/convex structure.

8. A method of adjusting an electron beam for irradiation of a target, comprising:

providing a reference sample including at least one reference pattern which has a plurality of lattice structures arranged along the circumference of a circle in a evaluation surface of said reference sample;

scanning said electron beam on the plurality of lattice structures within the same reference pattern;

converting a change in electrons caused by the scanning operation into an electric signal; and comparing a plurality of waveform blocks corresponding to said respective lattice structures within said electric signal to adjust said electron beam such that said waveform blocks become uniform.

9. A method according to claim 8, further comprising the step of repeating the step of comparing to adjust said electron beam such that the amplitude of said waveform block becomes maximal.

10. A method according to claim 8, further comprising the step of repeating the step of scanning for a plurality of said reference patterns.

* * * * *